(12) United States Patent
Ha

(10) Patent No.: US 12,130,994 B2
(45) Date of Patent: Oct. 29, 2024

(54) DISPLAY DEVICE

(71) Applicant: LG Display Co., Ltd., Seoul (KR)

(72) Inventor: Jongmoo Ha, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/058,140

(22) Filed: Nov. 22, 2022

(65) Prior Publication Data

US 2023/0214078 A1    Jul. 6, 2023

(30) Foreign Application Priority Data

Dec. 30, 2021 (KR) .................. 10-2021-0193485

(51) Int. Cl.
*G06F 3/044* (2006.01)
*H10K 59/131* (2023.01)
*H10K 59/40* (2023.01)

(52) U.S. Cl.
CPC ......... *G06F 3/0446* (2019.05); *H10K 59/131* (2023.02); *H10K 59/40* (2023.02); *G06F 2203/04111* (2013.01); *G06F 2203/04112* (2013.01)

(58) Field of Classification Search
CPC .............. H10K 59/40; G06F 3/0446; G06F 2203/04111; G06F 2203/04112; G06F 2203/04113
See application file for complete search history.

(56) References Cited

U.S. PATENT DOCUMENTS

| 11,086,462 | B2* | 8/2021 | Baek | G06F 3/0446 |
| 2014/0042398 | A1* | 2/2014 | Choi | G06F 3/0445 438/34 |
| 2016/0018348 | A1* | 1/2016 | Yau | G06F 3/0443 324/697 |
| 2019/0220123 | A1* | 7/2019 | Kanaya | H10K 59/40 |
| 2019/0265824 | A1* | 8/2019 | Abe | G06F 3/0446 |
| 2019/0319076 | A1* | 10/2019 | Lee | G06F 3/0412 |
| 2020/0012364 | A1* | 1/2020 | Ye | G06F 1/1637 |
| 2020/0026374 | A1* | 1/2020 | Chen | G06F 3/0443 |
| 2021/0110765 | A1* | 4/2021 | Sung | H10K 59/131 |
| 2022/0121321 | A1* | 4/2022 | Song | G06F 3/0443 |
| 2022/0326832 | A1* | 10/2022 | Lee | G06F 3/04166 |
| 2022/0391040 | A1* | 12/2022 | Yan | G06F 3/0445 |

FOREIGN PATENT DOCUMENTS

KR    10-2019-0075656 A    7/2019

* cited by examiner

*Primary Examiner* — Amy Onyekaba
(74) *Attorney, Agent, or Firm* — Seed IP Law Group LLP

(57) ABSTRACT

Provided is a display device. According to an aspect of the present disclosure, there is provided a display device. The display device includes a display panel including a display area and a non-display area. The display device further includes a plurality of first touch electrodes disposed in the display area and arranged in a first direction. The display device further includes a plurality of second touch electrodes disposed in the display area and arranged in a second direction perpendicular to the first direction. The display device further includes a bridge portion disposed between the plurality of first touch electrodes and including a first touch connection line configured to connect the plurality of first touch electrodes.

20 Claims, 12 Drawing Sheets

DISPLAY DEVICE

CROSS-REFERENCE TO RELATED APPLICATIONS

This application claims the benefit of and priority to Korean Patent Application No. 10-2021-0193485, filed on Dec. 30, 2021, in the Korean Intellectual Property Office, the disclosure of which is incorporated herein by reference.

BACKGROUND

Technical Field

The present disclosure relates to a display device.

Description of the Related Art

With the development of an information-oriented society, there is an increasing demand for display devices for displaying images. Various types of display devices such as a liquid crystal display device and an organic light-emitting display device are used as the display devices.

In order to provide more diverse features to a user, the display device recognizes the user's touch on a display panel and performs the input processing based on the recognized touch.

For example, the touch-recognizable display device may include a plurality of touch electrodes disposed on or embedded in the display panel and detect touch coordinates, whether the user's touch is disposed on the display panel, and the like by operating the touch electrodes.

BRIEF SUMMARY

Recently, there is an increasing demand for display panels with high touch performance. Therefore, the display device adopts design for improving the efficiency of the touch electrode itself. Touch electrodes having the same shape may be provided on the display panel and disposed at equal intervals to detect touching with the same touch property (or function) to meet the design requirements. Therefore, there is a problem in that touch performance of a touch region provided on an outer peripheral portion of a display area of the display panel is not uniform.

A benefit to be achieved by the present disclosure is to provide a display device having an arrangement structure of touch electrodes, in which touch sensing performance of a touch region of an outer peripheral portion of a display area of a display panel is equal to touch sensing performance of a touch region of a non-outer peripheral portion.

According to an aspect of the present disclosure, a display device includes: a display panel including a display area and a non-display area; a plurality of first touch electrodes disposed in the display area and arranged in a first direction; a plurality of second touch electrodes disposed in the display area and arranged in a second direction perpendicular to the first direction; and a bridge portion disposed between the plurality of first touch electrodes and including a first touch connection line configured to connect the plurality of first touch electrodes.

According to another aspect of the present disclosure, a display device includes: a plurality of light-emitting elements disposed in a display area; a plurality of signal lines disposed in a non-display area positioned outside the display area; a encapsulation part disposed on the light-emitting element and the signal line; a plurality of first touch electrodes disposed on the encapsulation part in the display area and arranged in a first direction; a plurality of second touch electrodes disposed on the encapsulation part in the display area and arranged in a second direction perpendicular to the first direction; and a connection portion disposed in a region between the plurality of first touch electrodes and a region between the plurality of second touch electrodes.

According to an embodiment of the present disclosure, the touch electrode in the touch region of the outer peripheral portion of the display area of the display panel is expanded, which makes it possible to improve the touch sensing performance.

According to an embodiment of the present disclosure, the touch sensing performance of the touch electrode of the outer peripheral portion of the display area of the display panel is improved, which makes it possible to ensure a degree of design freedom in terms of the shape of the outer peripheral portion of the display area.

BRIEF DESCRIPTION OF THE SEVERAL VIEWS OF THE DRAWINGS

The accompanying drawings, which are included to provide a further understanding of the disclosure and are incorporated in and constitute a part of this application, illustrate aspects and embodiments of the disclosure and together with the description serve to explain the principles of the disclosure.

DETAILED DESCRIPTION

Figure 1:
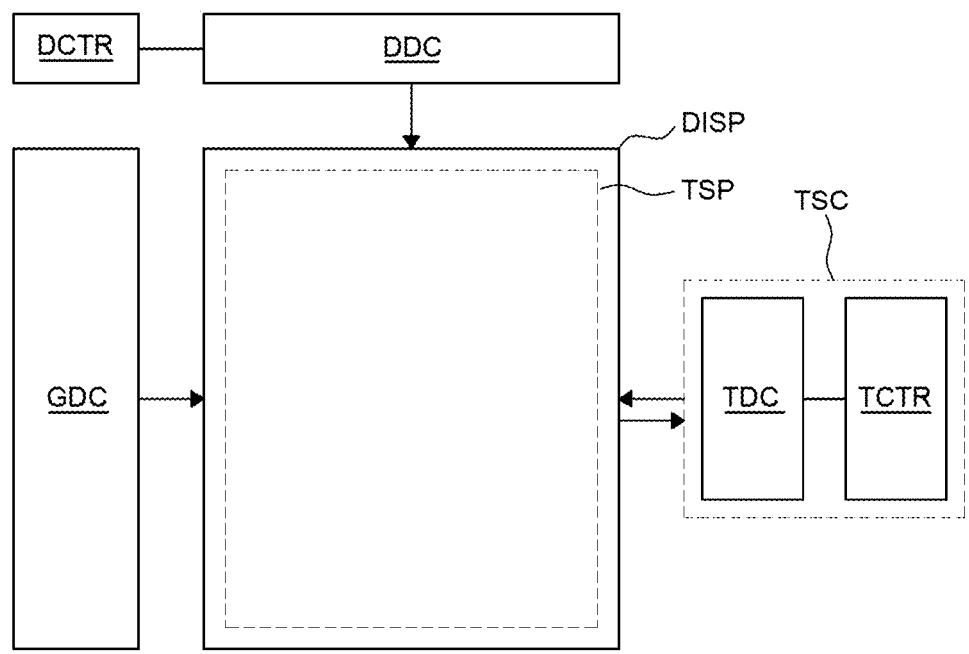
FIG. 1 illustrates a configuration of a display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the disclosure. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely adhered to or combined with each other and can be interlocked and operated in technically various ways, and the embodiments can be carried out independently of or in association with each other.

In the present disclosure, a display apparatus may include a liquid crystal module (LCM) including a display panel and a driver for driving the display panel, an organic light emitting display module (OLED module), and a quantum dot module (QD module). In addition, the display apparatus may also include equipment display apparatus including complete product or final product of LCM, OLED or QD module, for example, notebook computer, television, computer monitor, automotive display apparatus, or other vehicle display apparatuses, and set electronic devices or set device (set apparatus) such as mobile electronic devices of smart phone or electronic pad.

Accordingly, the display apparatus according to the present disclosure may include application products or set apparatuses such as final products including the LCM, OLED or QD module as well as display apparatuses such as LCM, OLED or QD module.

If needed, the LCM, OLED or QD module configured as the display panel, the driver, and the like may be expressed as the "display apparatus", and the electronic device of the final product including the LCM, OLED or QD module may be expressed as the "set apparatus". For example, the display apparatus may include a display panel of LCD, OLED or QD, and a source printed circuit board (source PCB) as a controller for driving the display panel. Meanwhile, the set apparatus may further include a set PCB as a set controller, which is electrically connected to the source PCB, so as to control the entire set apparatus.

The display panel used for the present embodiment may be all types of display panels, for example, a liquid crystal display panel, an organic light emitting diode OLED display panel, a quantum dot QD display panel, an electroluminescent display panel, and the like. The display panel is not limited to a particular display panel including a flexible substrate for an OLED display panel and a backplane support structure disposed beneath the display panel, thereby being capable of achieving bezel bending. The display panel used in the display apparatus according to an embodiment of the present disclosure is not limited in shape and size.

More specifically, when the display panel is an OLED display panel, the display panel may include a plurality of gate lines, a plurality of data lines, and a plurality of pixels PXL provided in respective intersections between the gate lines and the data lines. In addition, the display panel may further include an array including thin film transistors as elements for selectively applying a voltage to each of the pixels, an OLED layer disposed on the array, and an encapsulation substrate or an encapsulation layer disposed on the array to cover the OLED layer. The encapsulation layer protects the thin film transistors and the OLED layer from external impact and suppresses the permeation of moisture or oxygen into the OLED layer. Layers formed on the array may include an inorganic light emitting layer, for example, a nano-sized material layer or a quantum dot layer, and the like.

Hereinafter, there will be described in detail various configurations of a display device, in which an extension portion of a touch electrode may be disposed between touch blocks of the same type, touch performance, which is equal to touch performance between the touch blocks of the same type, may be ensured, the design may be simplified, design standardization may be implemented by the simplified design, and repeatability of a touch block may be easily inspected.

FIG. 1 illustrates a configuration of a display device according to an embodiment of the present disclosure.

With reference to FIG. 1, the display device according to the embodiment of the present disclosure may provide both a function of displaying images and a function of sensing touch.

To provide the image display function, the display device according to the embodiment of the present disclosure may include: a display panel DISP on which a plurality of data lines and a plurality of gate lines are disposed and a plurality of sub-pixels defined by the plurality of data lines and the plurality of gate lines is arranged; a data driving circuit DDC configured to operate the plurality of data lines; a gate driving circuit GDC configured to operate the plurality of gate lines; and a display controller DCTR configured to control an operation of the data driving circuit DDC and an operation of the gate driving circuit GDC.

The data driving circuit DDC, the gate driving circuit GDC, and the display controller DCTR may be implemented as one or more separate components. In some instances, two or more components, among the data driving circuit DDC, the gate driving circuit GDC, and the display controller DCTR, may be integrated into a single component. For example, the data driving circuit DDC and the display controller DCTR may be implemented as a single integrated circuit chip (IC Chip).

To provide the touch sensing function, the display device according to the embodiment of the present disclosure may include; a touch panel TSP including a plurality of touch electrodes; and a touch sensing circuit TSC configured to supply a touch driving signal TDS to the touch panel TSP, detect a touch sensing signal from the touch panel TSP, and sense a touch position (touch coordinate) or whether a user's touch is disposed on the touch panel TSP on the basis of the detected touch sensing signal.

For example, the touch sensing circuit TSC may include: a touch driving circuit TDC configured to supply the touch driving signal TDS to the touch panel TSP and detect the touch sensing signal from the touch panel TSP; and a touch controller TCTR configured to sense a touch position and/or whether the user's touch is disposed on the touch panel TSP on the basis of the touch sensing signal detected by the touch driving circuit TDC.

The touch driving circuit TDC may include a first circuit part configured to supply the touch driving signal TDS to the touch panel TSP, and a second circuit part configured to detect the touch sensing signal from the touch panel TSP.

The touch driving circuit TDC and the touch controller TCTR may be implemented as separate components or integrated into a single component in some instances.

The data driving circuit DDC, the gate driving circuit GDC, and the touch driving circuit TDC may each be implemented as one or more integrated circuits. The data driving circuit DDC, the gate driving circuit GDC, and the touch driving circuit TDC may be implemented as a chip-on-glass (COG) type, a chip-on-film (COF) type, or a tape carrier package (TCP) type in a standpoint related to the electrical connection with the display panel DISP. The gate driving circuit GDC may also be implemented as a gate-in-panel (GIP) type.

The circuit components DDC, GDC, and DCTR for the display operation and the circuit components TDC and TCTR for the touch sensing may be implemented as one or more separate components. In some instances, one or more components, among the circuit components DDC, GDC, and DCTR for the display operation, and one or more components, among the circuit components TDC and TCTR for the touch sensing, may be integrated functionally and implemented as one or more components.

For example, the data driving circuit DDC and the touch driving circuit TDC may be integrated into one integrated circuit chip or two or more integrated circuit chips. In the case in which the data driving circuit DDC and the touch driving circuit TDC are integrated into the two or more integrated circuit chips, the two or more integrated circuit chips may each have a data operating function and a touch operating function.

The display device according to the embodiment of the present disclosure may be an organic light-emitting display device or a liquid crystal display device. For example, various types of display panels DISP such as an organic light-emitting display panel or a liquid crystal display panel may be used. Hereinafter, an example will be described in which the display panel DISP is an organic light-emitting display panel.

The touch panel TSP may include: a plurality of touch electrodes to which the touch driving signal TDS may be applied or from which the touch sensing signal may be detected; and a plurality of touch routing lines configured to connect the plurality of touch electrodes to the touch driving circuit TDC.

The touch panel TSP may be disposed outside the display panel DISP. For example, the touch panel TSP and the display panel DISP may be separately manufactured and then coupled or connected. The type of touch panel TSP may be an externally-carried type or an add-on type, but the type of touch panel TSP is not limited to these terms.

As another example, the touch panel TSP may be embedded in the display panel DISP. For example, at the time of manufacturing the display panel DISP, the touch sensor structure including the plurality of touch electrodes and the plurality of touch routing lines, which constitute the touch panel TSP, may be formed together with the signal lines and electrodes for the display operation. The touch panel TSP may be called an embedded type. For the convenience of description, an example will be described below in which the touch panel TSP is the embedded type.

Figure 2:
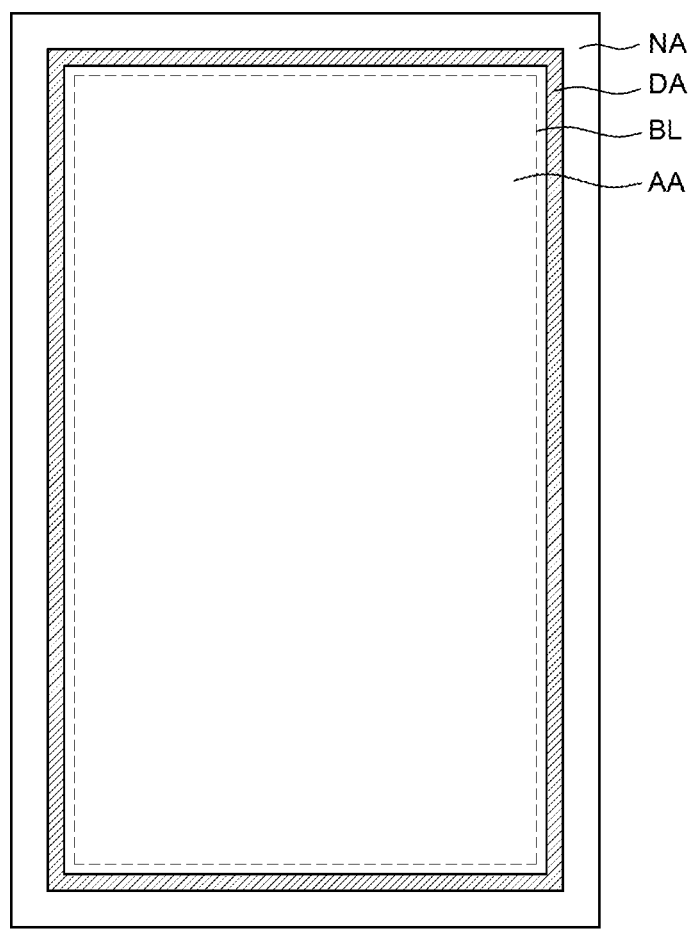
FIG. 2 illustrates a display panel of the display device according to an embodiment of the present disclosure.

FIG. 2 illustrates a display panel of the display device according to the embodiment of the present disclosure.

With reference to FIG. 2, the display panel DISP may include: an active area (or display area) AA in which images are displayed; and a non-active area (or non-display area) NA which is an outer peripheral region of a boundary line BL of an outer periphery of the active area AA. The active area AA may be a display area or a screen part, and the non-active area NA may be a non-display area or a bezel part, but the present disclosure is not limited to the terms.

The plurality of sub-pixels for the image display is arranged in the active area (or display area) AA of the display panel DISP. Various types of electrodes or signal lines for the display operation are disposed in the active area.

The plurality of touch electrodes for the touch sensing and the plurality of touch routing lines electrically connected to the plurality of touch electrodes may be disposed in the active area AA of the display panel DISP. Therefore, the active area AA may be called a touch sensing area that enables the touch sensing.

Link lines extending from various types of signal lines disposed in the active area AA may be disposed in the non-active area NA of the display panel DISP. Alternatively, link lines, which are electrically connected to various types of signal lines disposed in the active area AA, and pads, which are electrically connected to the link lines, may be disposed in the non-active area NA of the display panel DISP. The pads disposed in the non-active area NA may be bonded (or attached) or electrically connected to the display driving circuits (DDC, GDC, and the like).

The link lines extending from the plurality of touch routing lines disposed in the active area AA or the link lines electrically connected to the plurality of touch routing lines disposed in the active area AA and the pads electrically connected to the link lines may be disposed in the non-active area NA of the display panel DISP. The pads disposed in the non-active area NA may be bonded (or attached) or electrically connected to the touch driving circuit TDC.

A portion expanded from a part of an outermost peripheral touch electrode, among the plurality of touch electrodes disposed in the active area AA, may be present in the non-active area NA. One or more electrodes (touch electrodes) formed of the same material of the plurality of touch electrodes disposed in the active area AA may be disposed in the non-active area NA.

For example, all the plurality of touch electrodes disposed in the display panel DISP may be present in the active area AA. Alternatively, some (e.g., the outermost peripheral touch electrodes) of the plurality of touch electrodes disposed in the display panel DISP may be disposed in the non-active area NA. Alternatively, some (e.g., the outermost peripheral touch electrodes) of the plurality of touch electrodes disposed in the display panel DISP may be disposed over the active area AA and the non-active area NA.

With reference to FIG. 2, the display panel DISP of the display device according to the embodiment of the present disclosure may include a dam area DA in which a dam is disposed to inhibit any layer (e.g., an encapsulation part on the organic light-emitting display panel) in the active area AA from being collapsed.

The dam area DA may be positioned at a boundary point between the active area AA and the non-active area NA or at any one point in the non-active area NA that is the outer peripheral region of the active area AA.

The dam disposed in the dam area DA may be disposed while surrounding the active area AA in all directions. Alternatively, the dam may be disposed only at an outer peripheral portion of one or two or more parts (e.g., a portion where a layer, which is easily collapsed, is present) of the active area AA.

The dam disposed in the dam area DA may have a single pattern continuously connected or disconnected two or more patterns. In addition, only a first dam may be disposed in the dam area DA. Two dams (e.g., first and second dams) may be disposed in the dam area DA. Three or more dams may be disposed in the dam area DA. The contents of the present disclosure are not limited by the number of dams.

Only the first dam may be disposed in any one region in the dam area DA. Alternatively, both the first and second dams may be disposed in another region.

Figure 3:
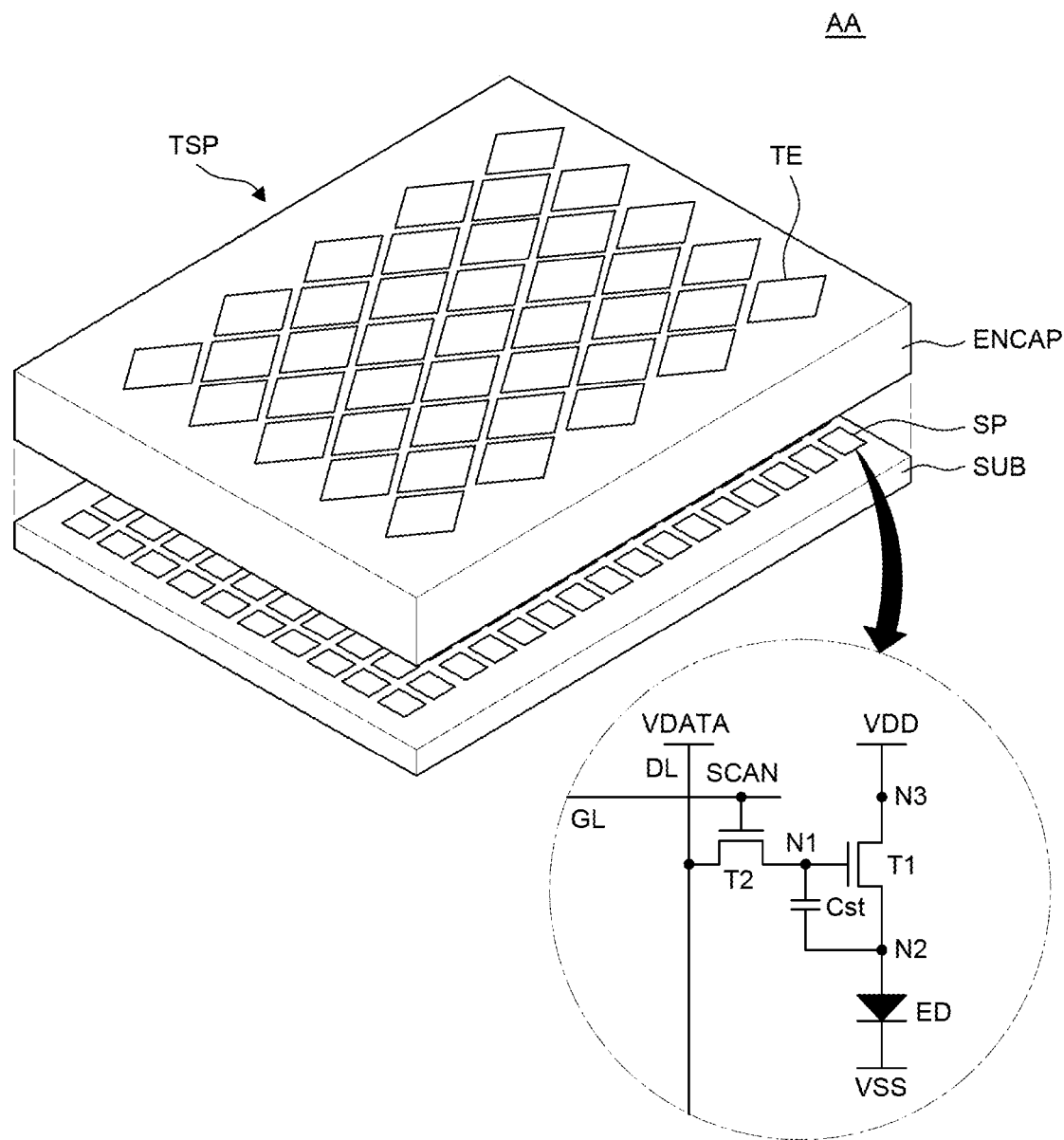
FIG. 3 illustrates a structure in which a touch panel is embedded in the display panel according to an embodiment of the present disclosure.

FIG. 3 illustrates a structure in which a touch panel is embedded in the display panel according to the embodiment of the present disclosure.

With reference to FIG. 3, a plurality of sub-pixels SP is arranged on a substrate SUB in the active area AA of the display panel DISP.

The sub-pixels SP may each include a light-emitting element ED, a first transistor T1 configured to operate the light-emitting element ED, a second transistor T2 configured to transmit data voltage VDATA to a first node N1 of the first transistor T1, and a storage capacitor Cst configured to maintain a predetermined voltage for one frame.

The first transistor T1 may include the first node N1 to which the data voltage VDATA may be applied, a second node N2 electrically connected to the light-emitting element ED, and a third node N3 to which a drive voltage VDD is applied from a drive voltage line. The first node N1 may be a gate node, the second node N2 may be a source node or drain node, and the third node N3 may be a drain node or source node. However, the present disclosure is not limited to the term. The first transistor T1 may be a driving transistor for operating the light-emitting element ED. However, the present disclosure is not limited to the term.

The light-emitting element ED may include a first electrode (e.g., an anode electrode), a light-emitting layer, and a second electrode (e.g., a cathode electrode). The first electrode may be electrically connected to the second node N2 of the first transistor T1, and a base voltage VSS may be applied to the second electrode.

The light-emitting layer of the light-emitting element ED may be an organic light-emitting layer formed of an organic material. For example, the light-emitting element ED may be an organic light-emitting diode (OLED).

The ON/OFF process of the second transistor T2 is controlled by a scan signal SCAN applied through a gate line GL. The second transistor T2 may be electrically connected between the first node N1 of the first transistor T1 and a data line DL. The second transistor T2 may be a switching transistor, but the present disclosure is not limited to the term.

When the second transistor T2 is turned on by the scan signal SCAN, the second transistor T2 transmits the data voltage VDATA, which is supplied from the data line DL, to the first node N1 of the first transistor T1.

The storage capacitor Cst may be electrically connected between the first node N1 and the second node N2 of the first transistor T1.

As illustrated in FIG. 3, the sub-pixels SP may each have a 2T1C structure including two transistors T1 and T2 and a single capacitor Cst. However, the present disclosure is not limited thereto. For example, the sub-pixels SP may each further include one or more transistors or further include one or more capacitors.

The storage capacitor Cst is not a parasitic capacitor (e.g., Cgs, Cgd) that is an internal capacitor that may be present between the first node N1 and the second node N2 of the first transistor T1. However, the storage capacitor Cst may be an external capacitor additionally designed outside the first transistor T1.

The first transistor T1 and the second transistor T2 may each be an n-type transistor or a p-type transistor.

As described above, the circuit elements such as the light-emitting element ED, the two or more transistors T1 and T2, and the one or more capacitors Cst are disposed on the display panel DISP. The circuit element (e.g., the light-emitting element ED) is vulnerable to outside moisture or oxygen. Therefore, an encapsulation part ENCAP may be disposed on the display panel DISP in order to inhibit outside moisture or oxygen from penetrating into the circuit element (in particular, the light-emitting element ED).

The encapsulation part ENCAP may be configured as a single or a plurality of layers. However, the present disclosure is not limited thereto.

According to the embodiment of the present disclosure, the touch panel TSP may be formed on the encapsulation part ENCAP.

For example, in the display device, the touch sensor structure including the plurality of touch electrodes TE constituting the touch panel TSP may be disposed on the encapsulation part ENCAP.

The touch driving signal TDS or the touch sensing signal may be applied to the touch electrode TE during the touch sensing. Therefore, unnecessary parasitic capacitance may occur because a potential difference occurs between the touch electrode TE and the cathode electrode disposed with the encapsulation part ENCAP interposed therebetween during the touch sensing. The parasitic capacitance may degrade the touch sensitivity. Therefore, to reduce the parasitic capacitance, a distance between the touch electrode TE and the cathode electrode may have a predetermined value (e.g., 1 µm) or more in consideration of a panel thickness, a panel manufacturing process, display performance, and the like. However, the present disclosure is not limited thereto. For example, a thickness of the encapsulation part ENCAP may be at least 1 µm or more. However, the present disclosure is not limited thereto.

Figure 4:
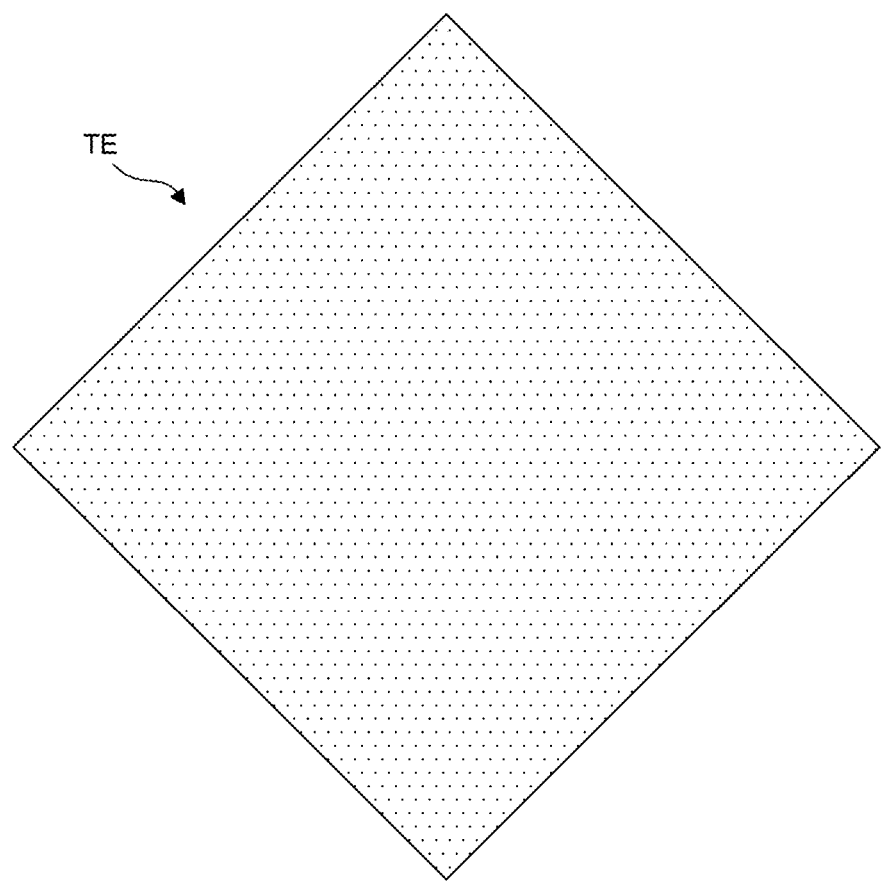
FIG. 4 illustrates a touch electrode disposed on the display panel according to an embodiment of the present disclosure.
Figure 5:
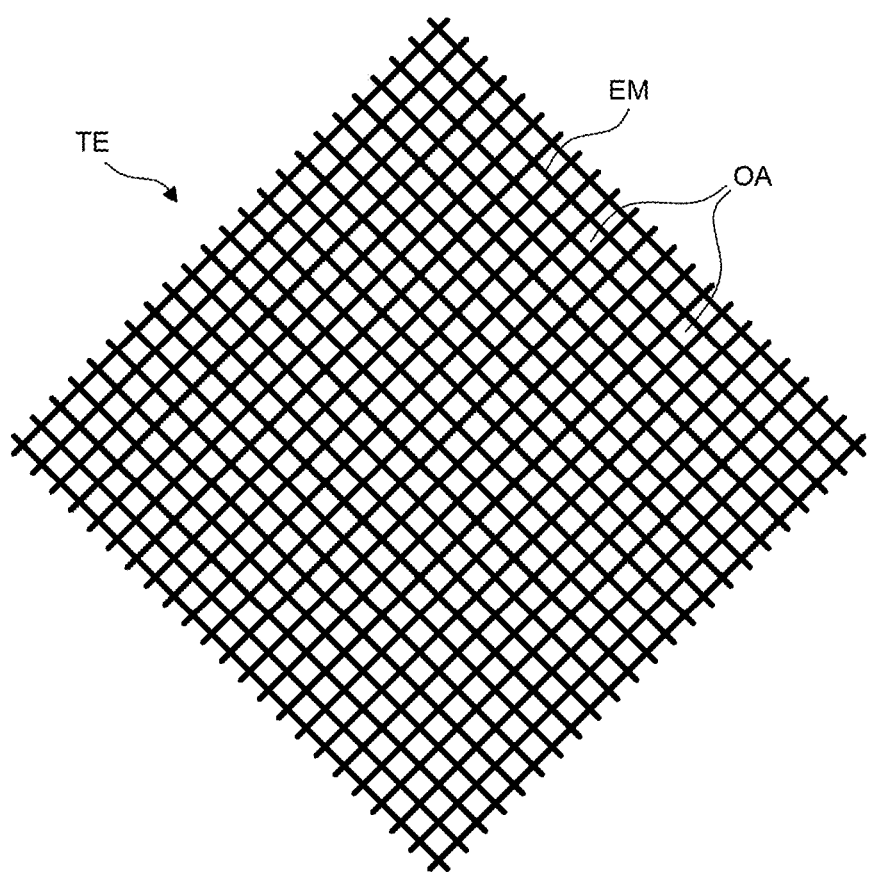
FIG. 5 illustrates a touch electrode disposed on the display panel according to an embodiment of the present disclosure.

FIGS. 4 and 5 illustrate a touch electrode disposed on the display panel according to the embodiment of the present disclosure.

As illustrated in FIG. 4, each of the touch electrodes TE disposed on the display panel DISP may be an electrode metal having a plate shape having no opening portion. In this case, each of the touch electrodes TE may be a transparent electrode. For example, each of the touch electrodes TE may be formed of a transparent electrode material so that light beams emitted from the plurality of sub-pixels SP disposed below the touch electrodes TE may propagate upward while passing through the touch electrodes TE.

As another embodiment, as illustrated in FIG. 5, each of the touch electrodes TE disposed on the display panel DISP may be an electrode metal EM having two or more opening portions OA by being patterned in a mesh shape.

The electrode metal EM may be a portion substantially corresponding to the touch electrode TE. The electrode metal EM may be a portion to which the touch driving signal TDS is applied or in which the touch sensing signal is detected.

As illustrated in FIG. 5, in the case in which each of the touch electrodes TE is an electrode metal EM patterned in a mesh shape, two or more opening portions OA may be present in the region of the touch electrode TE.

The two or more opening portions OA present in each of the touch electrodes TE may correspond to the light-emitting areas of the one or more sub-pixels SP. For example, the plurality of opening portions OA may be paths along which the light beams emitted from the plurality of sub-pixels SP disposed below the plurality of opening portions OA propagate upward. An example will be described below in which each of the touch electrodes TE is the mesh-type electrode metal EM.

The electrode metal EM corresponding to each of the touch electrodes TE may be positioned on the bank disposed in a region that is not the light-emitting areas of the two or more sub-pixels SP.

The method of forming several touch electrodes TE may form the several touch electrodes TE by widely forming the electrode metal EM in a mesh shape, cutting the electrode metal EM in a predetermined pattern, and electrically separating the electrode metals EM.

As illustrated in FIGS. 4 and 5, an outer peripheral shape of the touch electrode TE may be a quadrangular shape such as a diamond or rhombic shape or various shapes such as a triangular, pentagonal, or hexagonal shape. However, the present disclosure is not limited thereto.

Figure 6:
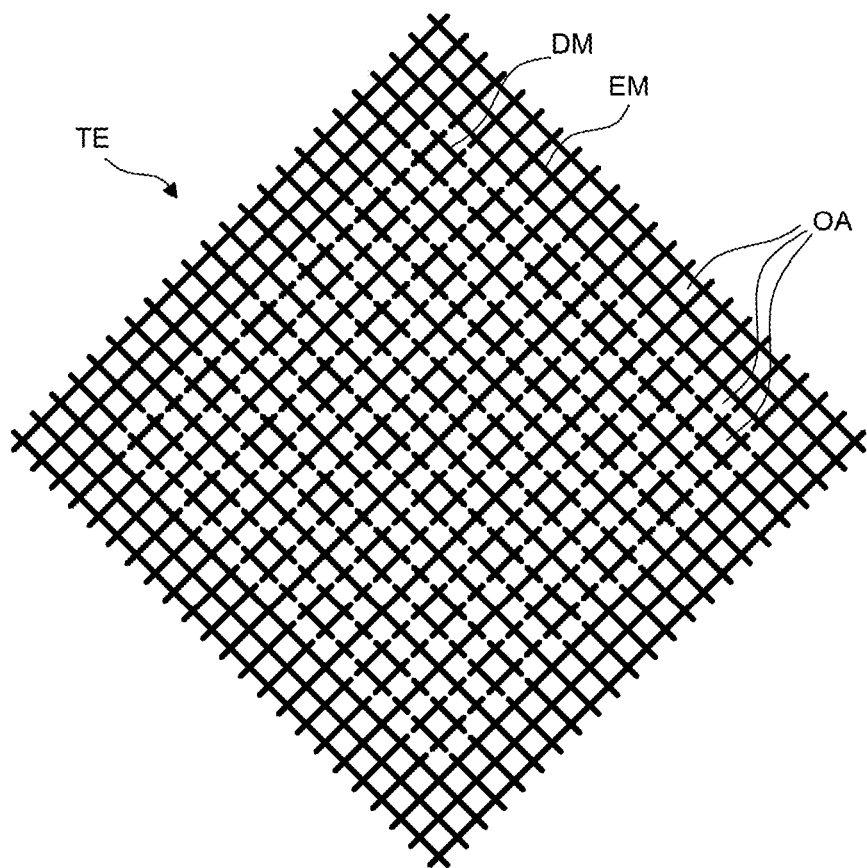
FIG. 6 illustrates a mesh-type touch electrode in FIG. 5.

FIG. 6 illustrates a mesh-type touch electrode in FIG. 5.

With reference to FIG. 6, one or more dummy metals DM disposed in the region of each of the touch electrodes TE and disconnected from the mesh-type electrode metal EM.

The electrode metal EM may be a portion substantially corresponding to the touch electrode TE. The electrode metal EM may be a portion to which the touch driving signal TDS is applied or in which the touch sensing signal is detected. The dummy metal DM may be a portion disposed in the region of the touch electrode TE. However, the dummy metal DM may be a portion to which no touch driving signal TDS is applied and in which no touch sensing signal is detected. For example, the dummy metal DM may be an electrically floating metal. Therefore, the electrode metal EM may be electrically connected to the touch driving circuit TDC. However, the dummy metal DM may not be electrically connected to the touch driving circuit TDC.

In the entire regions of all the touch electrodes TE, one or more dummy metals DM may be disposed in a state in which the dummy metals DM are disconnected from the electrode metal EM or the dummy metals DM are not connected to the electrode metal EM.

As another embodiment of the present disclosure, only in the regions of some of the touch electrodes TE, among the all the touch electrodes TE, one or more dummy metals DM may be disposed in a state in which the dummy metals DM are disconnected from the electrode metal EM or the dummy metals DM are not connected to the electrode metal EM. For example, no dummy metal DM may be disposed in the regions of the some of the touch electrodes TE.

As illustrated in FIG. 5, regarding the function of the dummy metal DM, there may occur a problem in that a contour of the electrode metal EM is visible on a screen when only the electrode metal EM is provided in a mesh shape without one or more dummy metals DM in the region of the touch electrode TE.

In contrast, as illustrated in FIG. 6, when the one or more dummy metals DM are present in the region of the touch electrode TE, it is possible to solve the problem in that the contour of the electrode metal EM is visible on the screen.

The touch sensitivity may be improved by adjusting a magnitude of capacitance for each of the touch electrodes TE by adjusting the presence or absence of the dummy metal DM or the number of dummy metals DM (a ratio of the dummy metal) for each of the touch electrodes TE.

The cut electrode metal EM may be formed as the dummy metal DM by cutting some points of the electrode metal EM formed in the region of the single touch electrode TE. For example, the electrode metal EM and the dummy metal DM may be formed on the same layer and formed of the same material.

The display device according to the embodiment of the present disclosure may sense the touch on the basis of capacitance occurring on the touch electrode TE.

The display device according to the embodiment of the present disclosure may sense the touch by using a touch sensing method based on mutual-capacitance, as a touch sensing method based on capacitance. Alternatively, the display device may sense the touch by using a touch sensing method based on self-capacitance. However, the present disclosure is not limited thereto.

In the case of the touch sensing method based on mutual-capacitance, the plurality of touch electrodes TE may include a driving touch electrode (transmitting/receiving touch electrode) to which the touch driving signal TDS is applied, and a sensing touch electrode (receiving touch electrode) configured to detect the touch sensing signal and form capacitance together with the driving touch electrode.

In the case of the touch sensing method based on the mutual-capacitance, the touch sensing circuit TSC senses the touch coordinate and/or whether the touch is disposed on the basis of a change in capacitance (mutual-capacitance) between the driving touch electrode and the sensing touch electrode in accordance with the presence or absence of a pointer such as a finger or a pen.

In the case of the touch sensing method based on self-capacitance, each of the touch electrodes TE may serve as both the driving touch electrode and the sensing touch electrode. For example, the touch sensing circuit TSC applies the touch driving signal TDS to the one or more touch electrodes TE and detects the touch sensing signal through the touch electrode TE to which the touch driving signal TDS is applied. Further, based on the detected touch sensing signal, the touch sensing circuit TSC senses the touch coordinate and/or whether the touch is formed by recognizing a change in capacitance between the touch electrode TE and the pointer such as the finger or the pen. In the case of the touch sensing method based on the self-capacitance, there is no difference between the driving touch electrode and the sensing touch electrode.

The display device according to the embodiment of the present disclosure may sense the touch by using a touch sensing method based on mutual-capacitance. Alternatively, the display device may sense the touch by using a touch sensing method based on self-capacitance. Hereinafter, an example will be described in which the display device performs the touch sensing based on mutual-capacitance and has the touch sensor structure to perform the touch sensing based on mutual-capacitance.

Figure 7:
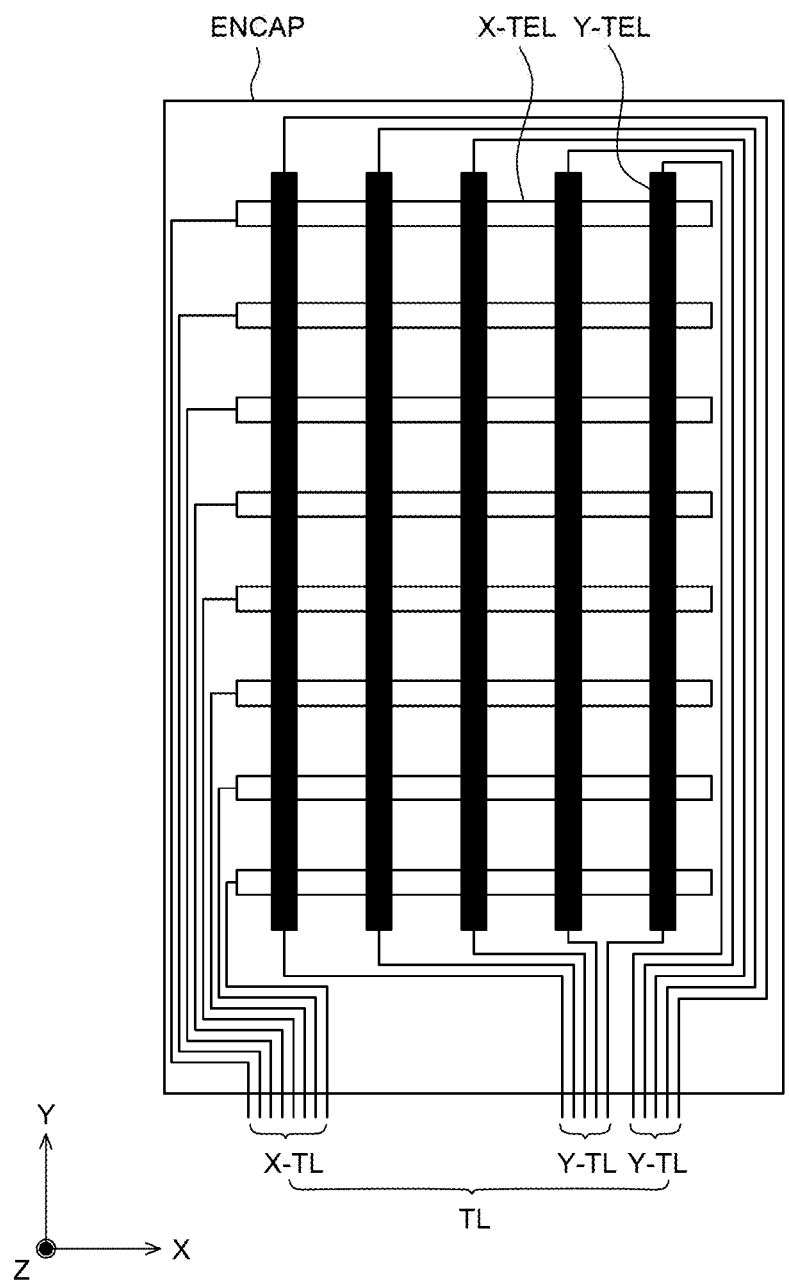
FIG. 7 illustrates a touch sensor structure of the touch panel according to an embodiment of the present disclosure.

FIG. 7 illustrates a touch sensor structure of the touch panel according to the embodiment of the present disclosure.

With reference to FIG. 7, the touch sensor structure for performing the touch sensing based on mutual-capacitance may include a plurality of X-touch electrode lines X-TEL and a plurality of Y-touch electrode lines Y-TEL. For example, the plurality of X-touch electrode lines X-TEL and the plurality of Y-touch electrode lines Y-TEL may be positioned on the encapsulation part ENCAP.

The plurality of X-touch electrode lines X-TEL may be disposed in a first direction, and the plurality of Y-touch electrode lines Y-TEL may be disposed in a second direction different from the first direction.

According to some embodiments of the present disclosure, the first direction and the second direction may be relatively different directions. For example, the first direction may be an x-axis direction, and the second direction may be a y-axis direction. On the contrary, the first direction may be the y-axis direction, and the second direction may be the x-axis direction. In addition, the first direction and the second direction may be orthogonal to each other but may not be orthogonal to each other. In addition, according to some embodiments of the present disclosure, the row and column are relative factors, and the row and column may change to each other.

The plurality of X-touch electrode lines X-TEL may include several X-touch electrodes X-TE electrically connected. The plurality of Y-touch electrode lines Y-TEL may include several Y-touch electrodes Y-TE electrically connected. For example, the plurality of X-touch electrodes X-TE and the plurality of Y-touch electrodes Y-TE may be electrodes included in the plurality of touch electrodes TE and separated in functions.

For example, the plurality of X-touch electrodes X-TE constituting the plurality of X-touch electrode lines X-TEL may be the driving touch electrodes. The plurality of Y-touch electrodes Y-TE constituting the plurality of Y-touch electrode lines Y-TEL may be the sensing touch electrodes. For example, the plurality of X-touch electrode lines X-TEL may each be the driving touch electrode line. The plurality of Y-touch electrode lines Y-TEL may each be the sensing touch electrode line.

On the contrary, the plurality of X-touch electrodes X-TE constituting the plurality of X-touch electrode lines X-TEL may be the sensing touch electrodes. The plurality of Y-touch electrodes Y-TE constituting the plurality of Y-touch electrode lines Y-TEL may be the driving touch electrodes. For example, the plurality of X-touch electrode lines X-TEL may each be the sensing touch electrode line. The plurality of Y-touch electrode lines Y-TEL may each be the driving touch electrode line.

The touch sensor metal for the touch sensing may include a plurality of touch routing lines TL in addition to the plurality of X-touch electrode lines X-TEL and the plurality of Y-touch electrode lines Y-TEL.

The plurality of touch routing lines TL may include one or more X-touch routing lines X-TL respectively connected to the plurality of X-touch electrode lines X-TEL, and one or more Y-touch routing lines Y-TL respectively connected to the plurality of Y-touch electrode lines Y-TEL.

Figure 8:
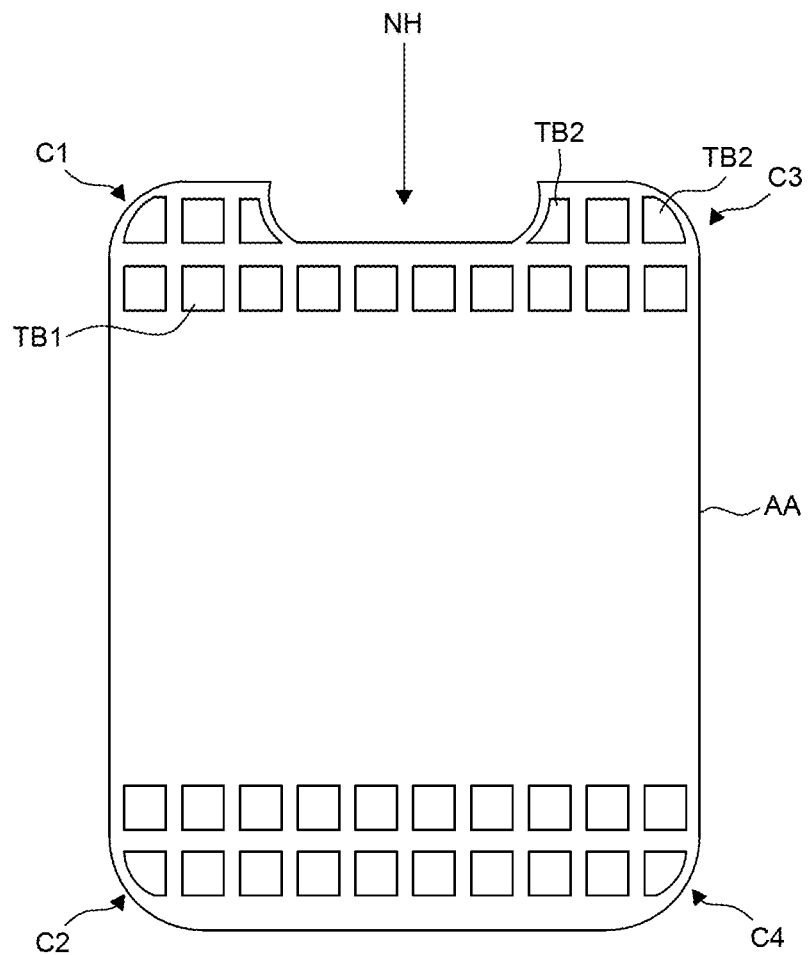
FIG. 8 illustrates a touch block of the display panel according to an embodiment of the present disclosure.

FIG. 8 illustrates a touch block of the display panel according to the embodiment of the present disclosure.

With reference to FIG. 8, the display device according to the embodiment of the present disclosure may include a plurality of touch blocks that serve as touch sensors.

The display panel according to the embodiment of the present disclosure may include a notch NH. The notch NH is a quadrangular or triangular portion formed by shaping a part of a planar portion. However, the notch NH may be an edge having a quadrangular or triangular shape. With reference to FIG. 8, the notch NH is illustrated as having a flat portion and rounded portions disposed at two opposite ends of the flat portion. For example, the notch NH may have various shapes such as a semicircular shape or a polygonal shape, but the present disclosure is not limited thereto. Components such as a camera may be positioned in the notch NH. The display area is formed at the two opposite sides of the notch NH, such that the display area of the display device may be further expanded. Therefore, it is possible to provide the user with the display device with the improved visibility.

The display panel of the display device according to the embodiment of the present disclosure may have rounded corners (or corner portions) C1, C2, C3, and C4. The notch NH and the rounded corners C1, C2, C3, and C4 of the display panel DISP may have various shapes. The shapes of the notch NH and the rounded corners are not limited to the shapes illustrated in the drawings.

The display panel DISP of the display device according to the embodiment of the present disclosure may include a plurality of touch blocks TB1 and TB2. The plurality of touch blocks TB1 and TB2 may have different areas. For example, the display panel may include a plurality of first touch blocks TB1 each having a first area, and a plurality of second touch blocks TB2 each having a second area smaller than the first area, but the present disclosure is not limited thereto. For example, three or more touch blocks TB1 and TB2 having different areas may be formed in accordance with the shape of the display panel DISP.

The second touch blocks TB2 may be disposed in regions adjacent to the notch NH and the rounded corners C1, C2, C3, and C4. For example, the second touch blocks TB2 may be disposed in the regions adjacent to the rounded shape of the notch NH and the regions adjacent to the rounded corners C1, C2, C3, and C4.

The first touch blocks TB1 may be disposed in the regions, except for the regions in which the second touch blocks TB2 are disposed. For example, the second touch block TB2 may be a touch electrode formed by removing a part of the first touch block TB1 and having a smaller area than the first touch block TB1. For example, the second touch blocks TB2 each having a smaller area than each of the first touch blocks TB1 are disposed in the regions adjacent to the notch NH and the rounded corners C1, C2, C3, and C4 in which it is difficult to arrange the first touch blocks TB1. Therefore, the entire display panel DISP may serve as the touch sensor.

The touch driving circuit TDC may include a touch driving part and a switching circuit part. The touch driving part may sequentially operate the plurality of first touch blocks TB1 and the plurality of second touch blocks TB2 by supplying the touch driving signals TDS sequentially to the plurality of first touch blocks TB1 and the plurality of second touch blocks TB2. Thereafter, the touch driving part receives the touch sensing signals from the plurality of first touch blocks TB1 and the plurality of second touch blocks TB2 to which the touch driving signals TDS are applied. The touch driving part may calculate whether the touch is formed, and the touch coordinate based on the touch sensing signals received from the plurality of first touch blocks TB1 and the plurality of second touch blocks TB2. For example, the touch driving signal TDS may have a waveform of a pulse modulation signal having two or more voltage levels. However, the present disclosure is not limited thereto.

The touch sensing signals received from the plurality of first touch blocks TB1 and the plurality of second touch blocks TB2 may vary depending on whether the touch is formed by a pointer such as a finger or a pen at the periphery of the corresponding touch block. The touch driving part may obtain whether the touch is formed and the touch coordinate by detecting the amount of change in capacitance in the touch blocks TB1 and TB2 based on the touch sensing signals.

Sensing lines may be respectively connected to the plurality of first touch blocks TB1 and the plurality of second touch blocks TB2 in order to supply the touch driving signals TDS to the plurality of first touch blocks TB1 and the plurality of second touch blocks TB2. The sensing lines may be grouped in a plurality of groups, and the plurality of groups may be connected to the touch blocks. The sensing lines respectively connected to the plurality of first touch blocks TB1 and the plurality of second touch blocks TB2 may be connected to the switching circuit part of the touch drive circuit TDC, which is configured to sequentially connect the plurality of first touch blocks TB1 and the plurality of second touch blocks TB2 to the touch driving part in order to supply the touch driving signal TDS sequentially to the plurality of first touch blocks TB1 and the plurality of second touch blocks TB2. The switching circuit part may include at least one multiplexer. However, the present disclosure is not limited thereto.

The plurality of first touch blocks TB1 and the plurality of second touch blocks TB2 may each be provided in the form of a touch electrode. However, the present disclosure is not limited thereto. The plurality of first touch blocks TB1 and the plurality of second touch blocks TB2 may each have a size equal or corresponding to a size of a region of one sub-pixel SP or have a size larger than the size of the region of the sub-pixel SP. The plurality of first touch blocks TB1 and the plurality of second touch blocks TB2 may be disposed in an in-cell type or an on-cell type in which the touch panel TSP is disposed and embedded in the display panel DISP.

The display device according to the embodiment of the present disclosure may operate in the display mode to provide the display function or operate in the sensing mode to provide the touch sensing function. For example, the plurality of first touch blocks TB1 and the plurality of second touch blocks TB2 may each operate as the touch sensor in the sensing section but may be used as an electrode in a display mode in a display section. For example, in the display section, the plurality of first touch blocks TB1 and the plurality of second touch blocks TB2 may each operate as a common electrode to which a common voltage Vcom is applied. The common voltage Vcom may be a voltage corresponding to a pixel voltage applied to a pixel electrode.

The sensing lines may be respectively connected to the plurality of first touch blocks TB1 and the plurality of second touch blocks TB2 in order to transmit the common voltages Vcom or the touch driving signals TDS to the plurality of first touch blocks TB1 and the plurality of second touch blocks TB2. Therefore, the touch driving signals TDS generated by the touch driving circuit TDC are transmitted to all or some of the plurality of first touch blocks TB1 and the plurality of second touch blocks TB2 through the sensing lines in the sensing section. The common voltages Vcom generated by the touch driving circuit TDC may be applied to the plurality of first touch blocks TB1 and the plurality of second touch blocks TB2 through the sensing lines in the display section. For example, in the sensing section of the display device according to the embodiment of the present disclosure, the touch driving signals TDS may be applied in reverse proportion to the areas of the plurality of first touch blocks TB1 and the areas of the plurality of second touch blocks TB2. Therefore, the touch driving signal TDS at a higher voltage level may be applied to the second touch block TB2 having a smaller area than the first touch block TB1, thereby improving the touch sensitivity.

In the display section of the display device according to the embodiment of the present disclosure, the common voltages Vcom may be applied in proportion to the areas of the plurality of first touch blocks TB1 and the areas of the plurality of second touch blocks TB2. For example, because the area of the first touch block TB1 is larger than the area of the second touch block TB2, a voltage level of the common voltage Vcom applied to the second touch electrode TB2 may be lower than a voltage level of the common voltage Vcom applied to the first touch block TB1. Therefore, the common voltage Vcom at a low voltage level is applied to the second touch block TB2 having a smaller area than the first touch block TB1, which makes it possible to suppress the deterioration in image quality caused by a resistance difference in accordance with the area.

Figure 9:
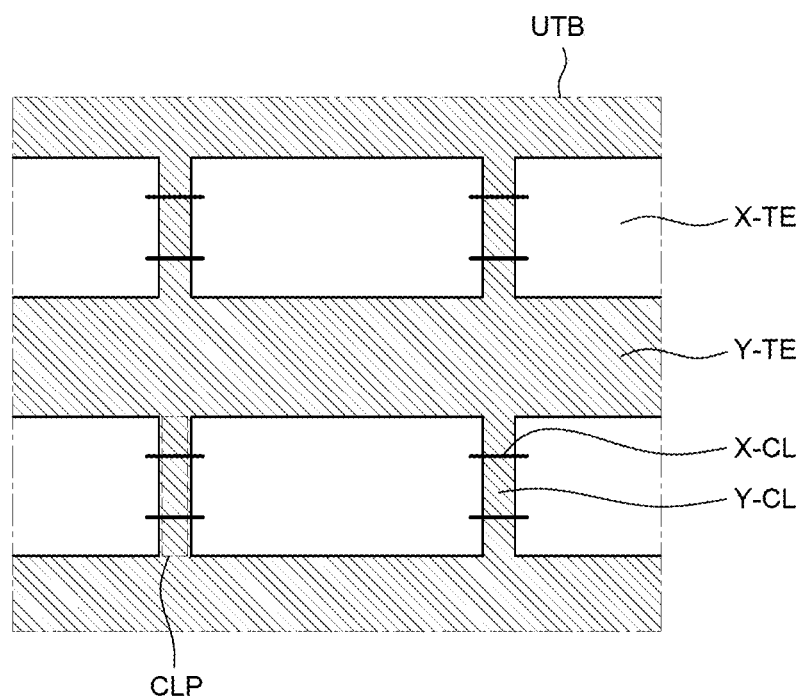
FIG. 9 illustrates the touch block according to an embodiment of the present disclosure.

FIG. 9 illustrates the touch block according to the embodiment of the present disclosure.

With reference to FIG. 9, the first touch block TB1 among the touch blocks TB1 and TB2 may be expresses as a unit touch block UTB. For example, the second touch block TB2 may be a touch electrode formed by removing a part of the unit touch block UTB and having a smaller area than the unit touch block UTB.

The unit touch block UTB may include a plurality of first touch electrodes X-TE arranged in the first direction, a plurality of second touch electrodes Y-TE arranged in the second direction perpendicular to the first direction, and bridge portions (or connection portions) CLP disposed between the plurality of first touch electrodes X-TE arranged in the first direction. The bridge portion CLP may include first touch connection lines X-CL that connect the plurality of first touch electrodes X-TE.

The bridge portions (or connection portions) CLP may further include second touch connection lines Y-CL configured to connect the plurality of second touch electrodes Y-TE. The bridge portions CLP may be disposed in the region between the plurality of first touch electrodes X-TE and the region between the plurality of second touch electrodes Y-TE. For example, the bridge portion CLP may be disposed in a region in which the region between the plurality of first touch electrodes X-TE and the region between the plurality of second touch electrodes Y-TE overlap.

The first touch connection line X-CL configured to connect the plurality of first touch electrodes X-TE and the second touch connection line Y-CL configured to connect the plurality of second touch electrodes Y-TE may be disposed in the bridge portion CLP. The first touch connection line X-CL may be formed on a layer different from a layer on which the plurality of first touch electrodes X-TE are formed. For example, in one embodiment the first touch connection line X-CL may be formed on a lower layer of or below the plurality of first touch electrodes X-TE. In another embodiment, the first touch connection line X-CL may be formed on an upper layer of or above the plurality of first touch electrodes X-TE. While there are two X-CL connection lines shown in FIG. 9, it can be appreciated that there could be a larger number of connection lines, for example four, six or more. The appropriate insulation layers will be positioned between the connection line X-CL and the connection line Y-CL and the second touch electrodes Y-TE to provide electrical isolation between them. The second touch connection line Y-CL may be formed on a layer identical to the layer on which the plurality of second touch electrodes Y-TE are formed. Because the second touch connection line Y-CL is formed on the same layer as the plurality of second touch electrodes Y-TE, the second touch connection line Y-CL may be formed of the same material as the plurality of second touch electrodes Y-TE.

Figure 10A:
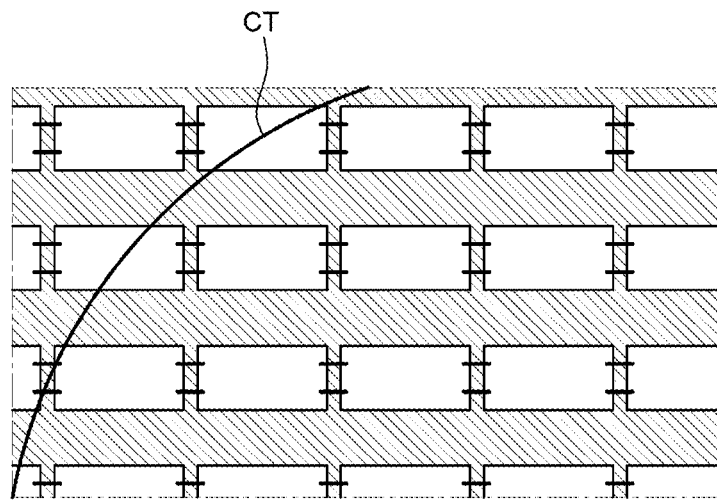
FIGS. 10A and 10B illustrate cutting lines of the display panel.
Figure 10B:
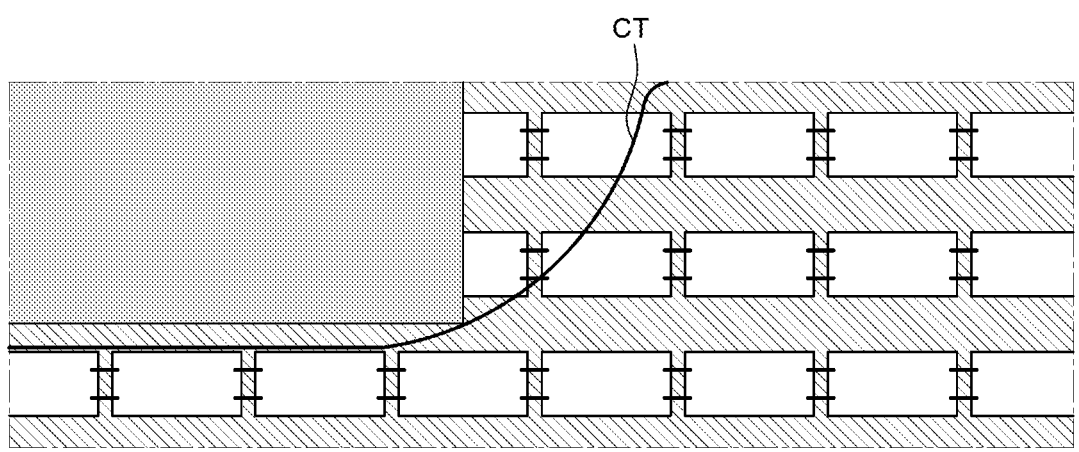

FIGS. 10A and 10B illustrate cutting lines of the display panel.

With reference to FIGS. 10A and 10B, the display panel DISP and the touch panel TSP according to the embodiment of the present disclosure may have the notch NH or the rounded corners C1, C2, C3, and C4, as illustrated in FIG. 8. The display panel DISP and the touch panel TSP, which are each provided in the form of a substrate, may each have a quadrangular shape. However, the present disclosure is not limited thereto. An outer peripheral line (or cutting line) CT in the preset display area AA may be trimmed by using a laser in accordance with the product. However, the present disclosure is not limited to this method. Therefore, the display panel DISP and the touch panel TSP may have the notch NH or the rounded corners C1, C2, C3, and C4.

The outer peripheral line (or cutting line) CT may traverse the unit touch block UTB. For example, the outer peripheral line CT may traverse partial regions of the first touch electrode X-TE, the second touch electrode Y-TE, and/or the bridge portion CLP in the unit touch block UTB.

With reference to FIG. 10A, the outer peripheral line CT may traverse the first touch electrode X-TE and the second touch electrode Y-TE and also penetrate the bridge portion CLP. The outer peripheral line CT may have various circular arc shapes. However, the present disclosure is not limited thereto. The unit touch block UTB trimmed by the laser may be formed as each of the rounded corners C1, C2, C3, and C4. The second touch block TB2 having a smaller area than the unit touch block UTB may be implemented by removing a part of the unit touch block UTB.

With reference to FIG. 10B, the outer peripheral line CT may traverse the first touch electrode X-TE and the second touch electrode Y-TE and also penetrate the bridge portion CLP. The outer peripheral line CT may have a shape formed by combining various circular arc shapes. However, the present disclosure is not limited thereto. The unit touch block UTB trimmed by the laser may be formed as the notch NH. The second touch block TB2 having a smaller area than the unit touch block UTB may be implemented by removing a part of the unit touch block UTB.

In some cases, a first touch electrode X-TE that is traversed by an outer peripheral line CT may correspond with an outermost peripheral touch electrode within a display area of a display panel. The outermost peripheral touch electrode may be adjacent to a notch or a non-display area of the display panel. An outermost peripheral touch electrode may be expanded to comprise an expanded touch electrode having a larger area than other touch electrodes within the display area that do not comprise outermost peripheral touch electrodes. An outermost peripheral touch electrode may be located at an outer peripheral portion of a display area of a display panel or at a boundary between a display area and a non-display area of the display panel.

Figure 11A:
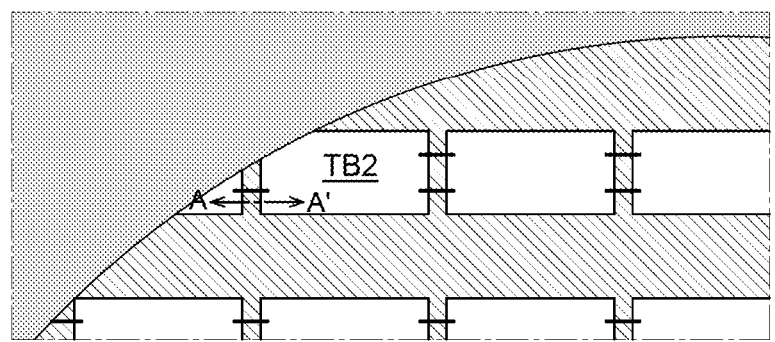
FIGS. 11A and 11B are a top plan view and a cross-sectional view of the display panel according to an embodiment of the present disclosure.
Figure 11B:
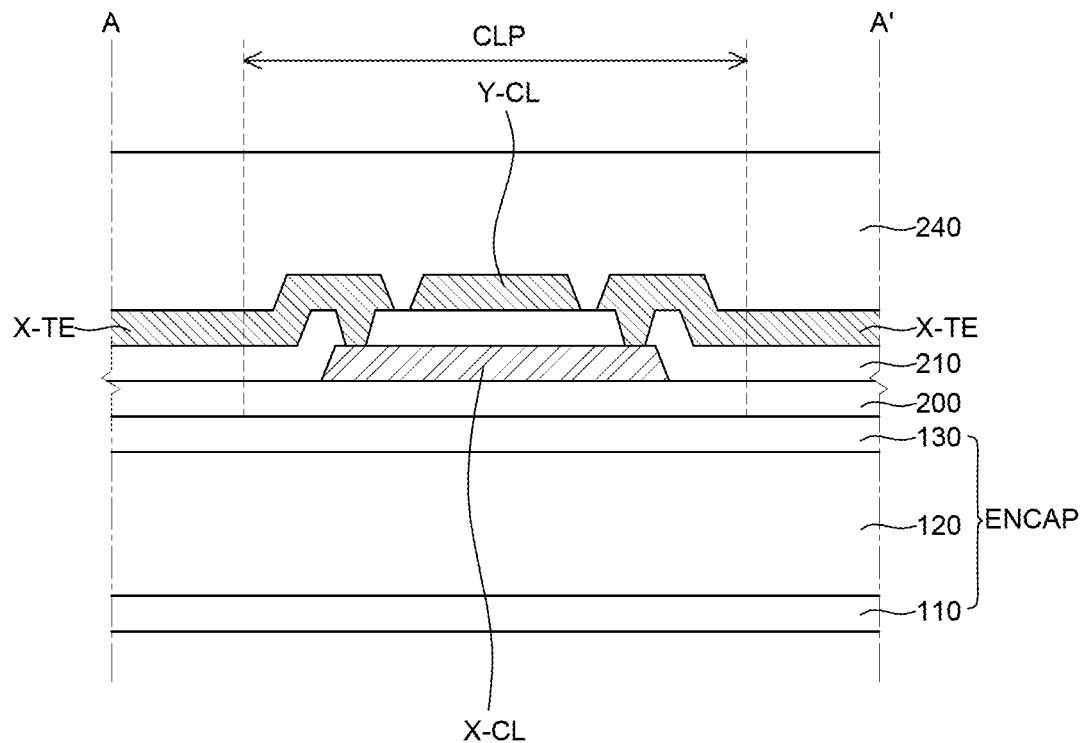

FIGS. 11A and 11B are a top plan view and a cross-sectional view formed by cutting the display panel according to the embodiment of the present disclosure.

With reference to FIG. 11A, the outer peripheral line CT may traverse any one bridge portion CLP and two adjacent first touch electrodes X-TE among the plurality of first touch electrodes X-TE. The bridge portion CLP may be disposed between the plurality of first touch electrodes X-TE and include the first touch connection line X-CL configured to connect the plurality of first touch electrodes X-TE. In addition, the bridge portion CLP may be disposed between the plurality of second touch electrodes Y-TE and include the second touch connection line Y-CL configured to connect the plurality of second touch electrodes Y-TE.

With reference to FIG. 11B, a touch part may be formed on an upper portion of the encapsulation part ENCAP including the first inorganic insulating film 110, the organic insulating film 120, and the second inorganic insulating film 130. The touch part may include the first touch electrode X-TE, the second touch electrode Y-TE, the first touch connection electrode X-CL, and the second touch connection electrode Y-CL disposed between the first touch insulating layer 200, the second touch insulating layer 210, and the third touch insulating layer 240. For example, the first touch electrode X-TE and the second touch electrode Y-TE may be disposed between the second touch insulating layer 210 and the third touch insulating layer 240. However, the present disclosure is not limited thereto.

In the bridge portion CLP, the first touch connection line X-CL may be formed between the first touch insulating layer 200 and the second touch insulating layer 210 and connect the two adjacent first touch electrodes X-TE in the form of a bridge. In this example, there is a connection line X-CL below the first touch electrodes X-TE, as can been seen in the cross-section of 11B. An electrical contact is formed from the first touch electrode X-TE to the connection line X-CL as shown. There might also be a connection line X-CL that is above the first touch electrodes X-TE in the same embodiment. In the bridge portion CLP, the second touch connection line Y-CL may be disposed between the second touch insulating layer 210 and the third touch insulating layer 240. The first touch connection line X-CL and the first touch electrode X-TE may be disposed on different layers. The second touch connection line Y-CL and the second touch electrode Y-TE may be disposed on the same layers. However, the present disclosure is not limited thereto.

While the outer peripheral line CT traversing any one bridge portion CLP is formed by the laser, the first touch connection line X-CL and/or the second touch connection line Y-CL disposed in the bridge portion CLP while traversing any one bridge portion CLP may be cut.

In FIG. 11A, the touch sensitivity may be measured at the periphery of the bridge portion CLP cut by the outer peripheral line CT. The touch sensitivity may be expressed as a ratio between the capacitance when no finger touch is formed and the capacitance when the finger touch is formed. The touch sensitivity of the second touch block TB2 in the FIG. 11A was measured as 13.1%.

Figure 12A:
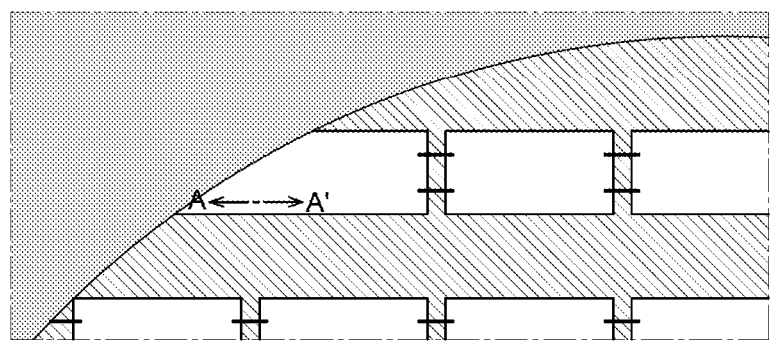
FIGS. 12A and 12B are a top plan view and a cross-sectional view of a display panel according to another embodiment of the present disclosure.
Figure 12B:
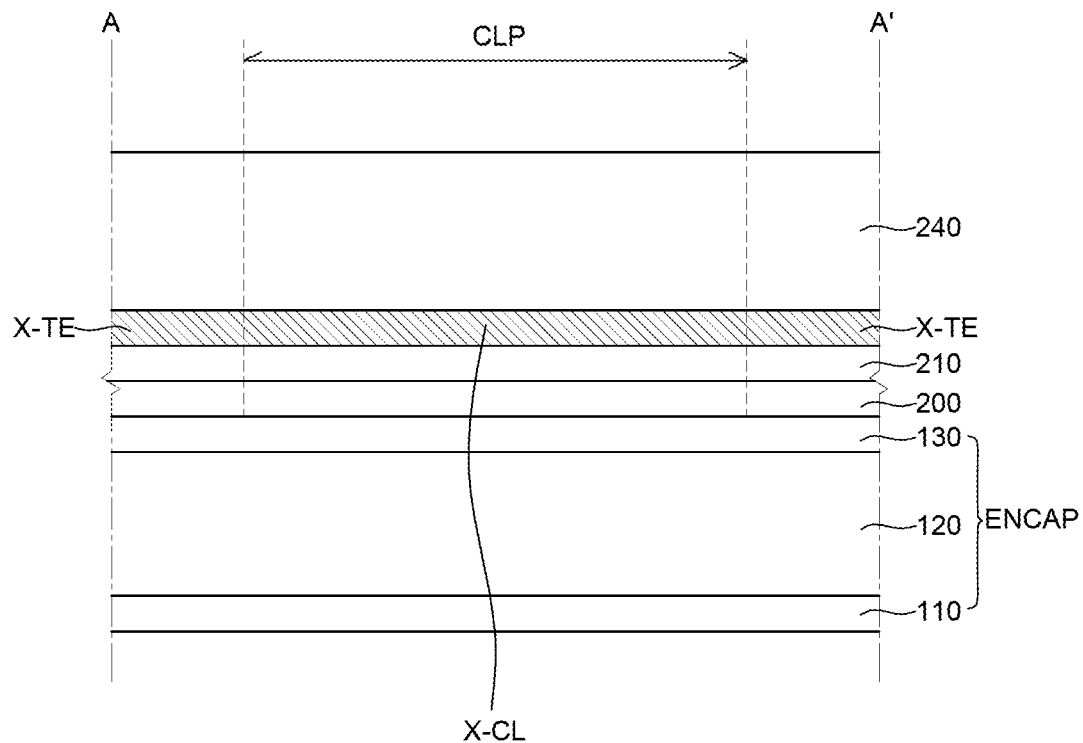

FIGS. 12A and 12B are a top plan view and a cross-sectional view of a display panel according to another embodiment of the present disclosure.

With reference to FIG. 12A, the first touch connection line X-CL may connect the two adjacent first touch electrodes X-TE among the plurality of first touch electrodes X-TE in any one bridge portion (or connection portion) CLP traversed by the outer peripheral line CT. For example, the first touch connection line X-CL of the bridge portion CLP may be formed of the same material as the first touch electrode X-TE. The first touch connection line X-CL of the bridge portion CLP may be disposed on the same layer as the plurality of first touch electrodes X-TE. The first touch connection line X-CL of the bridge portion CLP may be an electrode metal EM extending from the first touch electrode X-TE.

With reference to FIG. 12B, a touch part may be formed on an upper portion of the encapsulation part ENCAP including the first inorganic insulating film 110, the organic insulating film 120, and the second inorganic insulating film 130. The touch part may include the touch insulating layers (the first touch insulating layer 200, the second touch insulating layer 210, the third touch insulating layer 240), the first touch electrode X-TE and the first touch connection electrode X-CL disposed between the second touch insulating layer 210, and the third touch insulating layer 240. For example, the first touch electrode X-TE and the first touch connection line X-CL may be disposed on the same layer.

In the bridge portion CLP, the first touch connection line X-CL may be formed between the second touch insulating layer 210 and the third touch insulating layer 240 and connect the two adjacent first touch electrodes X-TE. In the bridge portion CLP, the first touch connection line X-CL may be disposed on the same layer as the first touch electrode X-TE. However, the present disclosure is not limited thereto. A length (or width) of the first touch connection line X-CL in the second direction may be equal to a height (or width or length) of the adjacent first touch electrode X-TE in the second direction.

While the outer peripheral line CT traversing any one bridge portion CLP is formed by the laser, the first touch connection line X-CL disposed in the bridge portion CLP while traversing any one bridge portion CLP may be cut.

In FIG. 12A, the touch sensitivity may be measured at the periphery of the bridge portion CLP cut by the outer peripheral line CT. The touch sensitivity may be expressed as a ratio between the capacitance when no finger touch is formed and the capacitance when the finger touch is formed. The touch sensitivity of the second touch block TB2 in the FIG. 12A was measured as 14.5%. For example, the touch sensitivity, which is measured after the first touch connection line X-CL is extended from the first touch electrode X-TE and disposed in the bridge portion CLP, is 14.5% that is increased by about 1.4% from 13.1% that is the touch sensitivity measured when the first touch connection line X-CL is not extended from the first touch electrode X-TE in the bridge portion CLP.

The first touch connection line X-CL of the bridge portion CLP illustrated in FIG. 12B may be formed of the same material as the electrode metal EM of the first touch electrode X-TE. The first touch connection line X-CL of the bridge portion CLP may have the same shape as the electrode metal EM of the first touch electrode X-TE. However, the present disclosure is not limited thereto. The first touch connection line X-CL may be an extension portion of the first touch electrode X-TE.

According to the display device according to the embodiment of the present disclosure, the touch electrode or the touch connection line in the touch region adjoining the outer peripheral line of the display area of the display panel is expanded, which makes it possible to improve the touch sensing ability. The touch sensing ability is improved in the outer peripheral portion of the display area of the display panel, which makes it possible to ensure a degree of design freedom in terms of the shape of the outer peripheral portion of the display arca.

The embodiments of the present disclosure can also be described as follows.

A display device according to an embodiment of the present disclosure comprises a display panel including a display area and a non-display area. The display device further includes a plurality of first touch electrodes disposed in the display area and arranged in a first direction. The display device further includes a plurality of second touch electrodes disposed in the display arca and arranged in a second direction perpendicular to the first direction. The display device further includes a bridge portion disposed between the plurality of first touch electrodes and configured to accommodate a first touch connection line configured to connect the plurality of first touch electrodes.

According to some embodiments of the present disclosure, the bridge portion may further include a second touch connection line configured to connect the plurality of second touch electrodes.

According to some embodiments of the present disclosure, the first touch connection line and the second touch connection line may be disposed on different layers.

According to some embodiments of the present disclosure, the second touch connection line may be disposed on the same layer as the plurality of second touch electrodes.

According to some embodiments of the present disclosure, the first touch connection line may be disposed on the same layer as the plurality of first touch electrodes.

According to some embodiments of the present disclosure, a length of the first touch connection line in the second direction may be equal to a height of the plurality of first touch electrodes.

According to some embodiments of the present disclosure, the first touch connection line may be formed of the same material and has the same shape as the plurality of first touch electrodes.

According to another embodiment of the present disclosure, a display device comprises a plurality of light-emitting elements disposed in a display area. The display device further includes a plurality of signal lines disposed in a non-display area positioned outside the display area. The display device further includes a encapsulation part disposed on the light-emitting element and the signal line. The display device further includes a plurality of first touch electrodes disposed on the encapsulation part in the display area and arranged in a first direction. The display device further includes a plurality of second touch electrodes disposed on the encapsulation part in the display area and arranged in a second direction perpendicular to the first direction. The display device further includes a connection portion disposed in a region between the plurality of first touch electrodes and a region between the plurality of second touch electrodes.

According to some embodiments of the present disclosure, the connection portion, which intersects an outer peripheral line of the display area, may be formed of the same material as the plurality of first touch electrodes.

According to some embodiments of the present disclosure, the connection portion may be disposed on the same layer as the plurality of first touch electrodes.

According to some embodiments of the present disclosure, the adjacent electrode metals of the plurality of first touch electrodes may extend and may be connected to each other in the connection portion that intersects an outer peripheral line of the display area.

According to some embodiments of the present disclosure, the connection portion may further include: a first touch connection line configured to connect the plurality of first touch electrodes; and a second touch connection line disposed on a layer different from a layer on which the first touch connection line is disposed, the second touch connection line being configured to connect the plurality of second touch electrodes.

It will be apparent to those skilled in the art that various modifications and variations can be made in the present disclosure without departing from the technical idea or scope of the disclosures. Thus, it is intended that the present disclosure covers the modifications and variations of this disclosure that come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a display panel comprising a display area and a non-display area;
   a plurality of first touch electrodes disposed in the display area and arranged in a first direction;
   a plurality of second touch electrodes disposed in the display area and arranged in a second direction perpendicular to the first direction; and
   a bridge portion disposed between two of the plurality of first touch electrodes and including a first touch connection line configured to connect the two of the plurality of first touch electrodes, and
   wherein the first touch connection line located at an outer peripheral portion of the display area is disposed on a same layer as the plurality of first touch electrodes,
   a width in the second direction of the first touch connection line is equal to a width in the second direction of the plurality of first touch electrodes.

2. The display device of claim 1, wherein the bridge portion further includes a second touch connection line configured to connect the plurality of second touch electrodes.

3. The display device of claim 2, wherein the first touch connection line and the second touch connection line are disposed on different layers.

4. The display device of claim 3, wherein the second touch connection line is disposed on the same layer as the plurality of second touch electrodes.

5. The display device of claim 1, wherein the first touch connection line is formed of the same material and has the same shape as the plurality of first touch electrodes.

6. The display device of claim 1, further comprising: a plurality of light-emitting elements disposed within a display area of the display panel; and an encapsulation part arranged above the plurality of light-emitting elements,
   wherein the plurality of first touch electrodes, the plurality of second touch electrodes and bridge portion are disposed on the encapsulation part.

7. The display device of claim 1, wherein a first voltage applied to the first touch electrode connected to the first touch connection line being located at the outer peripheral portion is different from a second voltage applied to other touch electrodes among the plurality of first touch electrodes.

8. A display device, comprising:
   a plurality of light-emitting elements disposed in a display area;
   a plurality of signal lines disposed in a non-display area positioned outside the display area;
   an encapsulation part disposed on the plurality of light-emitting elements and the plurality of signal lines;
   a plurality of first touch electrodes disposed on the encapsulation part in the display area and arranged in a first direction;
   a plurality of second touch electrodes disposed on the encapsulation part in the display area and arranged in a second direction perpendicular to the first direction; and
   a connection portion disposed in a region between the plurality of first touch electrodes and a region between the plurality of second touch electrodes, the connection portion including a first touch connection line configured to connect two first touch electrodes of the plurality of first touch electrodes,
   wherein the first connection line located at an outer peripheral portion of the display area is disposed on a same layer as the plurality of first touch electrodes, and
   a width in the second direction of the first touch connection line is equal to a width in the second direction of the plurality of first touch electrodes.

9. The display device of claim 8, wherein the connection portion, which intersects an outer peripheral line of the display area, is formed of the same material as the plurality of first touch electrodes.

10. The display device of claim 9, wherein the connection portion is disposed on the same layer as the plurality of first touch electrodes.

11. The display device of claim 8, wherein adjacent electrode metals of the plurality of first touch electrodes extend and are connected to each other in the connection portion that intersects an outer peripheral line of the display area.

12. The display device of claim 8, wherein the connection portion further includes: a second touch connection line disposed on a layer different from a layer on which the first touch connection line is disposed, the second touch connection line being configured to connect the plurality of second touch electrodes.

13. A display panel, comprising:
   a plurality of light-emitting elements disposed within a display area of the display panel;
   an encapsulation part arranged above the plurality of light-emitting elements;
   a plurality of first touch electrodes disposed on the encapsulation part and arranged in a first direction;
   an expanded touch electrode arranged in the first direction and electrically connected to at least one of the plurality of first touch electrodes, the expanded touch electrode having a larger area than any of the plurality of first touch electrodes, the expanded touch electrode being located at an outer peripheral portion of the display area; and
   a connection portion disposed in a region between the plurality of first touch electrodes, the connection portion including a first touch connection line configured to connect two first touch electrodes of the plurality of first touch electrodes, wherein the first connection line located at an outer peripheral portion of the display area is disposed on a same layer as the plurality of first touch electrodes, and a width in the second direction of the first touch connection line is equal to a width in the second direction of the plurality of first touch electrodes.

14. The display panel of claim 13, wherein: the expanded touch electrode overlaps with a non-display area of the display panel.

15. The display panel of claim 13, wherein: the expanded touch electrode is wider than any of the plurality of first touch electrodes.

16. The display panel of claim 13, wherein: a first voltage applied to the expanded touch electrode is different from a second voltage applied to a second touch electrode of the plurality of first touch electrodes.

17. The display panel of claim 16, wherein: the first voltage applied to the expanded touch electrode is determined based on an area of the expanded touch electrode; and the second voltage applied to the second touch electrode is determined based on an area of the second touch electrode.

18. The display panel of claim 13, further comprising: a connection portion disposed in a region between the expanded touch electrode and a second touch electrode of the plurality of first touch electrodes; and a connection line within the connection portion electrically connecting the expanded touch electrode and the second touch electrode.

19. The display panel of claim 18, wherein: the connection line is disposed below the expanded touch electrode.

20. The display panel of claim 13, wherein: the expanded touch electrode comprises an outermost peripheral touch electrode within the display area of the display panel.

\* \* \* \* \*